United States Patent
Sato et al.

(10) Patent No.: US 8,786,237 B2
(45) Date of Patent: Jul. 22, 2014

(54) VOLTAGE REGULATOR AND COOLING CONTROL INTEGRATED CIRCUIT

(71) Applicant: Renesas Electronics America Inc., Santa Clara, CA (US)

(72) Inventors: Tetsuo Sato, San Jose, CA (US); Isao Shimura, Gunnma (JP); Tsutomu Kawano, Kanagawa (JP)

(73) Assignee: Renesas Electronics America Inc., Santa Clara, CA (US)

( * ) Notice: Subject to any disclaimer, the term of this patent is extended or adjusted under 35 U.S.C. 154(b) by 0 days.

(21) Appl. No.: 13/755,812

(22) Filed: Jan. 31, 2013

(65) Prior Publication Data

US 2013/0146275 A1    Jun. 13, 2013

Related U.S. Application Data

(63) Continuation of application No. 12/727,832, filed on Mar. 19, 2010, now Pat. No. 8,400,091.

(51) Int. Cl.
*G05B 5/00*    (2006.01)

(52) U.S. Cl.
USPC .............................. 318/471; 318/34; 318/67

(58) Field of Classification Search
USPC .................... 318/471, 34, 67; 361/33, 686
See application file for complete search history.

(56) References Cited

U.S. PATENT DOCUMENTS

2003/0146383 A1* 8/2003 Knauth et al. ............. 250/338.1
2004/0246675 A1* 12/2004 Lin ............................... 361/686

* cited by examiner

*Primary Examiner* — Karen Masih
(74) *Attorney, Agent, or Firm* — Campbell Stephenson LLP

(57) ABSTRACT

According to an embodiment of the invention, an apparatus is provided which includes a microprocessor, and a built-in temperature sensor configured to measure a temperature of the microprocessor as a reference temperature. The apparatus further includes external temperature sensors, where at least one of the external temperature sensors is configured to measure the temperature of the microprocessor. The microprocessor is configured to make an external temperature calibration using the reference temperature measured by the built-in temperature monitor. Each of the external temperature sensors is configured to monitor temperature information of a component and provide the temperature information to the microprocessor.

11 Claims, 8 Drawing Sheets

VOLTAGE REGULATOR AND COOLING CONTROL INTEGRATED CIRCUIT

CROSS-REFERENCE TO RELATED APPLICATIONS

The present patent application is a continuation of U.S. patent application Ser. No. 12/727,832, filed on Mar. 19, 2010, entitled "VOLTAGE REGULATOR AND COOLING CONTROL INTEGRATED CIRCUIT" and is incorporated by reference herein in its entirety and for all purposes as if completely and fully set forth herein.

BACKGROUND

1. Field

Embodiments of the present invention generally relate to electronics. More specifically, certain embodiments of the present invention relate to voltage regulation, temperature detection, and temperature control.

2. Description of the Related Art

In computer systems, components, such as a central processing unit ("CPU") a graphics processing unit ("GPU"), or a memory unit, can consume power at a high rate during operation. The amount of power that the components consume is controlled, in part, by a voltage regulator ("VR"), which maintains the voltage level of the components at a constant level. The high rate of power consumption during operation can cause the components to produce a large amount of heat. This heat must be dissipated in order to keep the components within their safe operating temperatures. If a component exceeds its safe operating temperature, the component may overheat which can lead to performance instability, malfunction, or permanent damage.

To avoid component overheating, computer systems can include peripheral devices that help keep the heat of each component at a safe operational level. An example of such a peripheral device is a cooling fan. A cooling fan is a fan, generally within a computer case, that can be used for cooling purposes. A cooling fan can draw cooler air into the computer case from outside, expel warm air from inside, or move air across a heat sink to cool a particular component. A computer system can have one or more cooling fans (or other cooling devices) in order to maintain a safe temperature for its components.

In order to know when to activate a cooling fan, and to know how much power to provide to the cooling fan, a computer system needs to know the temperature of its components, especially the components that have a high rate of power consumption. In order to provide the temperature of its components, the computer system can include additional peripheral devices that monitor the temperature. An example of such a peripheral device is a thermistor. Another example is a diode. A thermistor or diode can monitor the temperature of a component, and communicate that temperature in order to manage safe operation of the component. If a computer system has multiple components that could potentially overheat, then a computer system can have multiple thermistors (or diodes or other temperature sensors), one for each component, in order to monitor the temperature of each component.

Therefore, a computer system may require multiple VRs, temperature sensors, and cooling fans, where these three types of peripheral devices can work together to ensure safe operation of its components. Furthermore, these three types of peripheral devices can be connected to each other using a data bus for adaptive control. For higher reliability, the computer system may need to increase its temperature monitor points and intelligent voltage and cooling controllers configured to control the VRs and cooling fans, respectively. However, any increase in additional peripheral devices results in an increase in printed circuit board ("PCB") space and cost. Thus, it is difficult to obtain high reliability, high efficiency, and low power requirements, without also incurring an increase in PCB space and cost.

SUMMARY

According to an embodiment, an apparatus includes a microprocessor, and a built-in temperature sensor configured to measure a temperature of the microprocessor as a reference temperature. The apparatus further includes external temperature sensors, where at least one of the external temperature sensors is configured to measure the temperature of the microprocessor. The microprocessor is configured to make an external temperature calibration using the reference temperature measured by the built-in temperature monitor. Each of the external temperature sensors is configured to monitor temperature information of a component and provide the temperature information to the microprocessor.

According to another embodiment, a method includes measuring a temperature, and determining whether the measured temperature is higher than a first threshold. The method further includes, when the measured temperature is higher than a first threshold, determining whether a speed of a cooling fan is less than a maximum speed of the cooling fan. The method further includes, when the speed of the cooling fan is less than the maximum speed of the cooling fan, increasing the speed of the cooling fan. The method further includes, when the speed of the cooling fan is equal to the maximum speed of the cooling fan, determining whether a voltage generated by a voltage regulator can be decreased. The method further includes, when the voltage generated by the voltage regulator can be decreased, decreasing the voltage generated by the voltage regulator.

BRIEF DESCRIPTION OF THE DRAWINGS

Further embodiments, details, advantages, and modifications of the present invention will become apparent from the following detailed description of the preferred embodiments, which is to be taken in conjunction with the accompanying drawings, wherein.

DETAILED DESCRIPTION

It will be readily understood that the components of the present invention, as generally described and illustrated in the figures herein, may be arranged and designed in a wide variety of different configurations. Thus, the following detailed description of the embodiments of a method and apparatus, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, the usage of the phrases "certain embodiments," "some embodiments," or other similar language, throughout this specification refers to the fact that a particular feature, structure, or characteristic described in connection with the embodiment may be included in at least one embodiment of the present invention. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments.

Furthermore, as is consistent with the knowledge of one of ordinary skill in the art of electronics, a controller is defined as a chip or integrated circuit (IC) that interfaces with a peripheral device. Thus, as one of ordinary skill in the art would readily appreciate, the terms "controller" and "control IC" are interchangeable and refer to the same structure.

As described above, in a computer system, there can be one or more components that produce a large amount of heat due to a large rate of power consumption. For example, these components can include the CPU, the GPU, a metal-oxide-semiconductor field-effect transistor ("MOSFET") of a VR driver, an output inductor, or a memory. To provide a secure thermal design and control, it would be ideal for the computer system to also include many temperature sensors in order to accurately sense the temperature of each of the components that can potentially overheat. A PCB pattern thermal control IC (also identified as a thermal control IC) is also necessary in order to process the input of the multiple temperature sensors. However, as the number of temperature sensors increase, multiple thermal control ICs are needed, as there is a limit to how many temperature sensors a single PCB pattern thermal control IC can support. The use of multiple thermal control ICs significantly increases the size and cost of the PCB.

Figure 1:
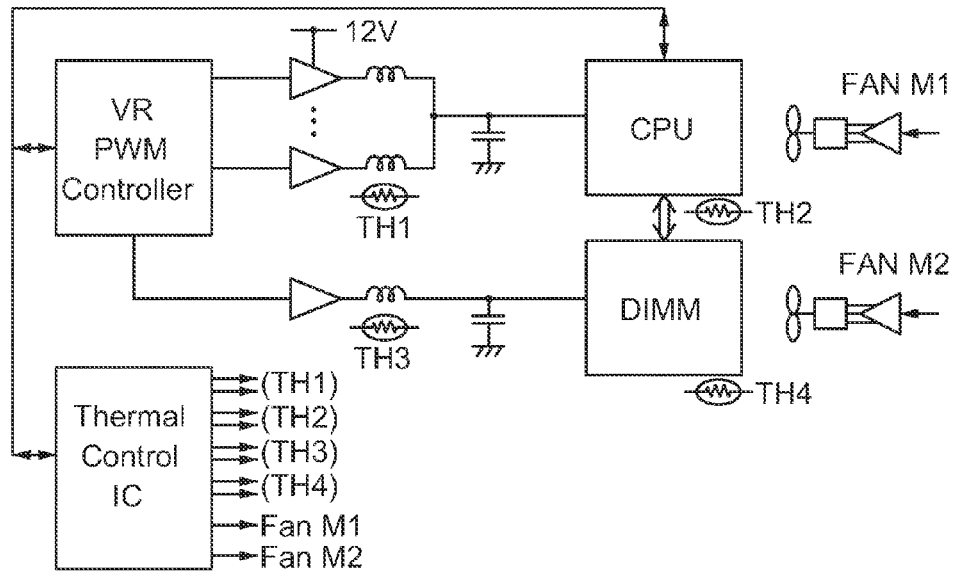
FIG. 1 illustrates a block diagram of a voltage regulator and cooling system for a server.

FIG. 1 illustrates a block diagram of a typical voltage regulator and cooling system for a server. The server includes a multi-core CPU (identified as "CPU" in FIG. 1), and a high speed memory, such as a dual in-line memory module ("DIMM") (identified as "DIMM" in FIG. 1). The server further includes a VR multi-phase/multi-rail pulse-width modulation ("PWM") control IC (identified as "VR PWM Controller") configured to regulate the voltage of the CPU and the DIMM. In a high task operation, the CPU and DIMM can consume power at a high rate and generate a high amount of heat. The server also includes temperature sensors, such as thermistors or diodes (identified as "TH1", "TH2", "TH3", and "TH4" in FIG. 1) configured to monitor the temperature of thermal critical devices. In FIG. 1, the thermal critical devices are the CPU (monitored by TH2), the DIMM (monitored by TH4), the driver of the PWM controller (monitored by TH1), and the output inductor (monitored by TH3). The temperature sensors are further configured to communicate the monitored temperatures to the CPU and a thermal control IC (identified as "Thermal Control IC" in FIG. 1). The server further includes multiple cooling fans (identified as "Fan M1" and Fan M2" in FIG. 1) configured to remove heat from a thermal critical device. The thermal control IC has a fan motor control function to control the movement of the multiple cooling fans. Thus, the thermal control IC is configured to receive temperature sensing input from the temperature sensors and control the operation of the multiple cooling fans based on the received temperature sensing input.

Figure 2:
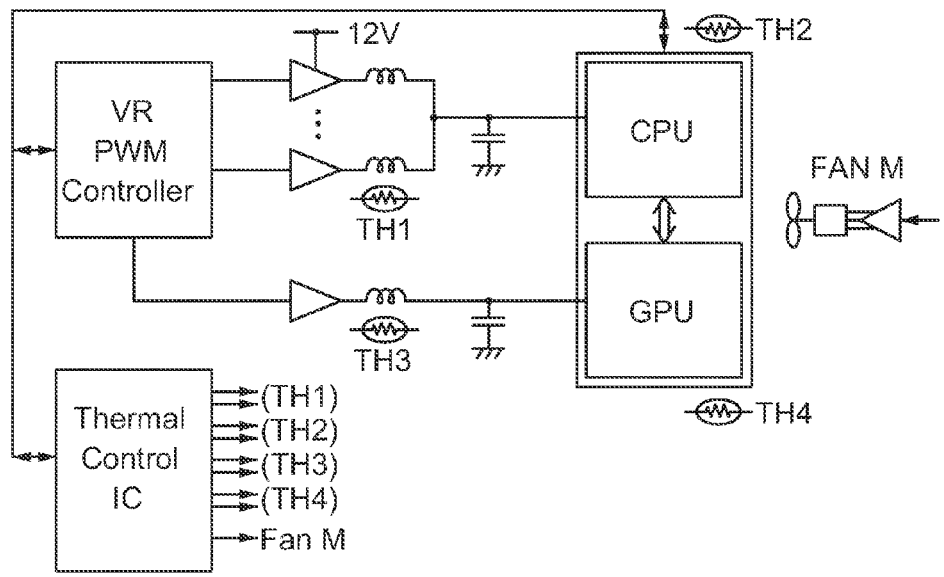
FIG. 2 illustrates a block diagram of a voltage regulator and cooling system of a notebook personal computer.

FIG. 2 illustrates a block diagram of a typical voltage regulator and cooling system of a notebook personal computer ("NBPC"). A NBPC is similar to a server, and has similar components to a server. However, because a NBPC generally has a more compact configuration than a server, a NPBC needs to accommodate its components and maintain a reasonable internal temperature using a limited space as compared to a server. Similar to the server in FIG. 1, the NBPC includes a multi-core CPU (identified as "CPU" in FIG. 1). The NBPC further includes a GPU (identified as "GPU" in FIG. 2), which is coupled to the CPU via a communication bus. Similar to the server in FIG. 1, the NBPC further includes a VR multi-phase/multi-rail PWM control IC (identified as "VR PWM Controller") configured to regulate the voltage of the CPU and the GPU.

Much like the server in FIG. 1, the NBPC also includes temperature sensors, such as thermistors or diodes (identified as "TH1", "TH2", "TH3", and "TH4" in FIG. 2) configured to monitor the temperature of thermal critical devices. In FIG. 2, the thermal critical devices are the CPU (monitored by TH2), the GPU (monitored by TH4), the driver of the PWM controller (monitored by TH1), and the output inductor (monitored by TH3). The temperature sensors are further configured to communicate the monitored temperatures to the CPU and a thermal control IC (identified as "Thermal Control IC" in FIG. 2). The NBPC further includes a cooling fan (identified as "Fan M" in FIG. 2) configured to remove heat from a thermal critical device. The NBPC only includes one cooling fan, as compared to the two cooling fans of the server in FIG. 1 which highlights the fact that there is limited space in the NBPC, and thus the need to reduce the number of peripheral devices is greater. The thermal control IC has a fan motor control function to control the movement of the single cooling fan.

Thus, the voltage regulator and cooling system illustrated in FIG. 1 and FIG. 2 both use a thermal control IC to sense the internal temperature and control the operation of one or more cooling fans. As can be seen in FIG. 1 and FIG. 2, the thermal control IC is located away from the VR block, which includes the VR PWM control IC, the VR driver, and the output inductor. This is because the VR block comprises many components which are tightly gathered in a small area, and also because VR drivers should ideally be located as close to a thermal critical device (e.g., CPU, GPU, DIMM) as possible. Because the thermal control IC is located away from the VR block, a communication bus, such as a two-wire data communication bus, is used to connect the thermal control IC, the VR PWM control IC, and the thermal critical device (in most cases, the CPU). The communication bus allows the thermal control IC, the VR PWM control IC and the thermal critical device to communicate with each other, and provide for adaptive and intelligent control of the VR and the cooling fan(s). However, the use of a bus introduced a bandwidth limitation on the control instructions that are sent to and from the thermal control IC and the VR PWM control IC. A longer connection path between the thermal critical device and the thermal control IC can also result in less accurate temperature measurements due to common mode noise and leakage.

Figure 3:
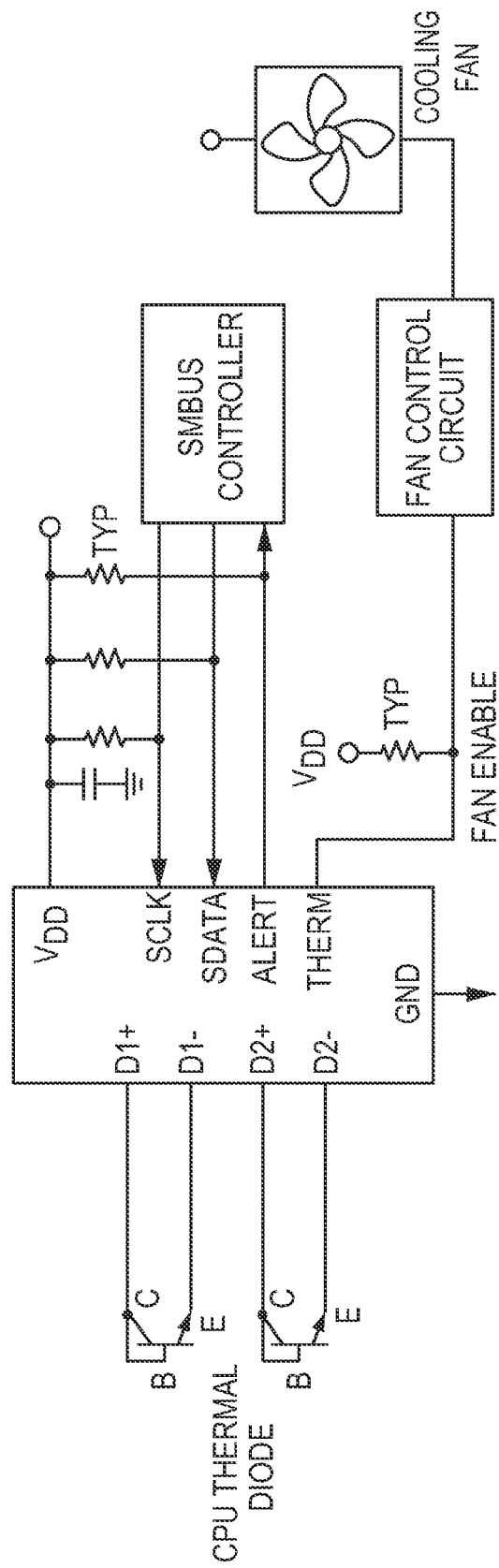
FIG. 3 illustrates an example of an application circuit configured to sense temperature at multiple locations using multiple temperature sensors.

FIG. 3 illustrates a typical example of an application circuit configured to sense temperature at multiple locations using multiple temperature sensors. The application circuit includes two thermal diodes (identified in FIG. 3 as "CPU Thermal Diode") configured to monitor the temperature of a thermal critical component (such as a CPU or GPU). The thermal diodes can be located in the thermal critical component or can be discrete diode connected transistors. The application circuit also includes a digital thermometer and temperature alarm (identified in FIG. 3 as "Digital Thermometer/Temperature Alarm"), where the digital thermometer and temperature alarm are configured to measure the temperature of the two thermal diodes. The digital thermometer and temperature alarm can communicate over a 2-wire serial interface. The digital thermometer and temperature alarm is further configured to send an alert output signal to an system management bus ("SMBus") controller (identified in FIG. 3 as "SMBus Controller") when an on-chip or remote temperature exceeds a programmed limit, and is further configured to send a thermal input to a fan control IC (identified in FIG. 3 as "Fan Control Circuit") so that the fan control IC can operate a cooling fan (identified in FIG. 3 as "Cooling Fan") in order to reduce the temperature within the programmed limit.

Figure 4:
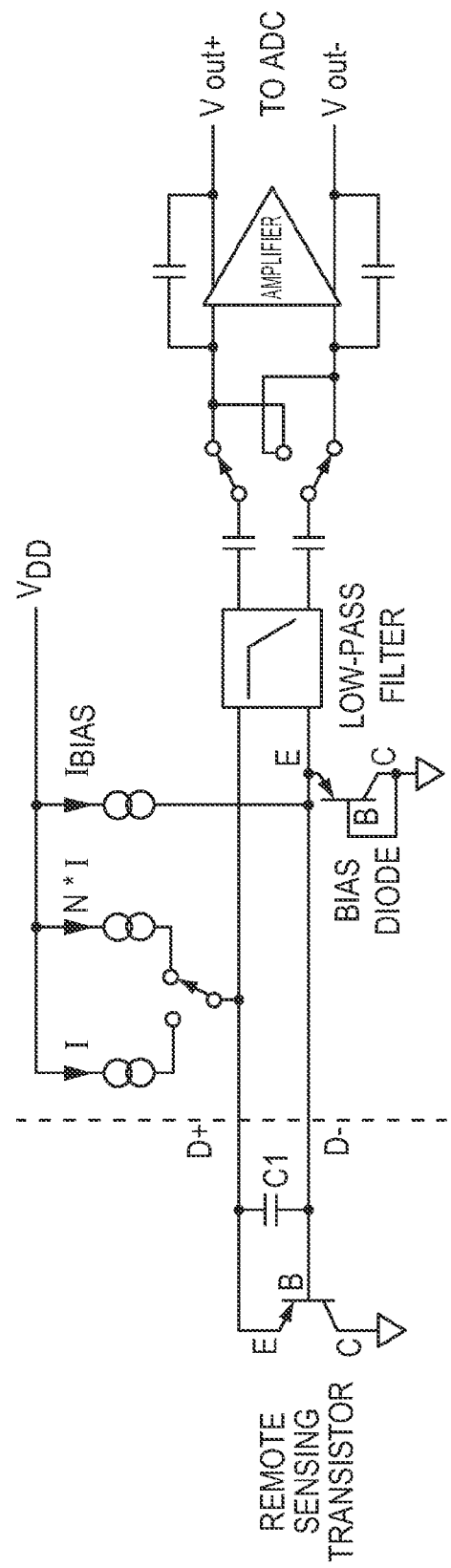
FIG. 4 illustrates an example of a sensing input circuit.

FIG. 4 illustrates a typical sensing input circuit. The sensing input circuit includes a remote temperature sensor (identified in FIG. 4 as "Remote Sensing Transistor). The remote temperature sensor is operated at a constant current and produces a base-emitter voltage ($V_{BE}$). The sensing input circuit is configured to measure the change in base-emitter voltage ($\Delta V_{BE}$) by switching the operating current of the remote temperature sensor among two related currents (identified as "I" and "N*I" in FIG. 4). To prevent ground noise interfering with the measurement, the more negative terminal of the remote temperature sensor is biased above ground by an internal diode (identified as "Bias Diode" in FIG. 4) at a D-input. In addition, a capacitor (identified as "C1" in FIG. 4) may optionally be used as a noise filter with a maximum value of 1,000 Pf.

The resulting $\Delta V_{BE}$ waveforms are passed through a low-pass filter (identified as "Low-Pass Filter" in FIG. 4) to remove noise and then to a chopper-stabilized amplifier (identified as "Amplifier" in FIG. 4). This amplifies and rectifies the waveform to produce a direct current ("DC") voltage proportional to $\Delta V_{BE}$.

The DC voltage is then passed to an analog-to-digital converter ("ADC") (not shown) which digitizes the voltage and produces a temperature measurement. The temperature can be calculated using the following formula:

$$T = \Delta V_{BE} * q/(k * \ln N)$$

T is the absolute temperature in Kelvins. K is Boltzmann's constant (i.e., 1.38E-23). q is the charge on the electron (i.e., 1.6E-19 Coulombs). N is the ration of the two currents I and N*I. While the sensing input circuit does not require any calibration to null the effect of the absolute value of $V_{BE}$, the sensitivity is too small. For example, when current I is equal to 10 uA and current N*I is equal to 200 uA (and thus, N is equal to 20), temperature sensitivity is only +0.26 mV/° C. A temperature sensitivity this small means that the sensing input circuit is susceptible to noise and leakage, as will be discussed in more detail. Thus, the sensing input circuit would need a special PCB layout, such as the connection between the temperature sensor and the temperature control IC being as close as possible, or an additional component such as a twist pair line or guard ring, in order to mitigate the noise and leakage.

Furthermore, as described above, to provide a secure thermal design and control, it is ideal for the computer system to include multiple temperature sensors in order to accurately sense the temperature of each of the components that can potentially overheat. However, as the number of temperature sensors increase, multiple thermal control ICs are needed because of a sensor and control IC connection limitation, as there is a limit to how many temperature sensors a single thermal control IC can support. As described above, the use of multiple thermal control ICs significantly increases the size and cost of the PCB.

In addition, the use of multiple temperature sensors and multiple thermal control ICs increase the likelihood of increased connection length between a temperature sensor and a thermal control IC. This also poses a problem as increased connection length can increase an error in measured temperatures by a thermal control IC, as discussed below in relation to FIGS. 5 and 6.

Figure 5:
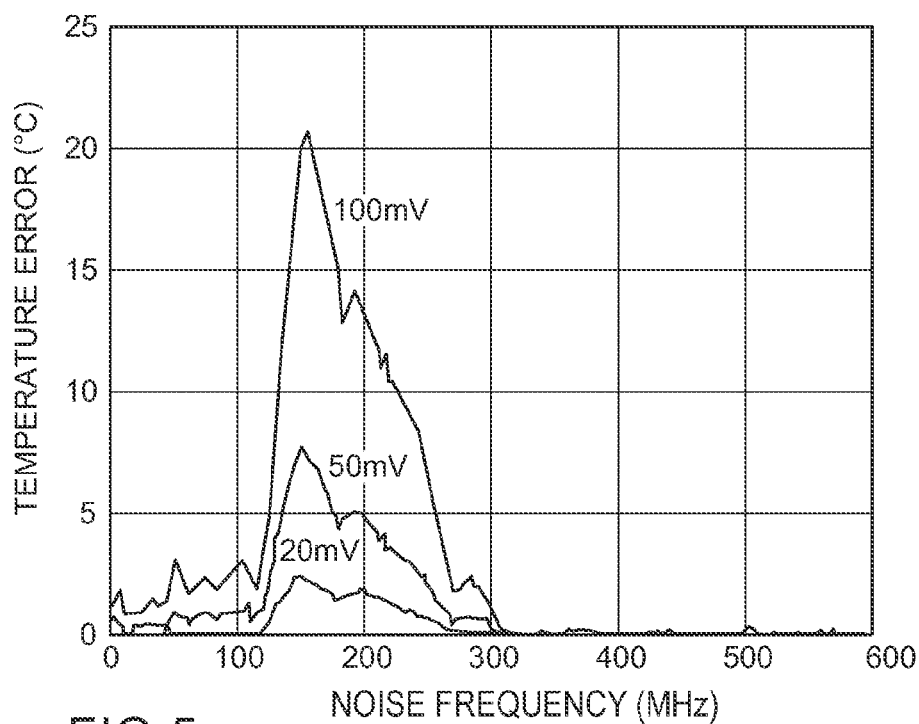
FIG. 5 illustrates a chart which correlates a common mode noise amount with a temperature sensing error amount.

FIG. 5 illustrates a chart which correlates a common mode noise frequency amount with a temperature sensing error amount. In electronics, noise is any unwanted disturbance to a desired signal. The longer a signal has to travel to reach a destination, the more likely the signal can be disturbed by noise. FIG. 5 shows that noise disturbance can cause a temperature error in the measured temperature of a critical thermal component. For example, at 50 mV, FIG. 5 shows that a common-mode noise at a frequency of 200 MHz causes a temperature error of −5° C. Thus, a shorter connection between a temperature sensor and a thermal control IC reduces the likelihood of a significant temperature error through reduction of common-mode noise.

Figure 6:
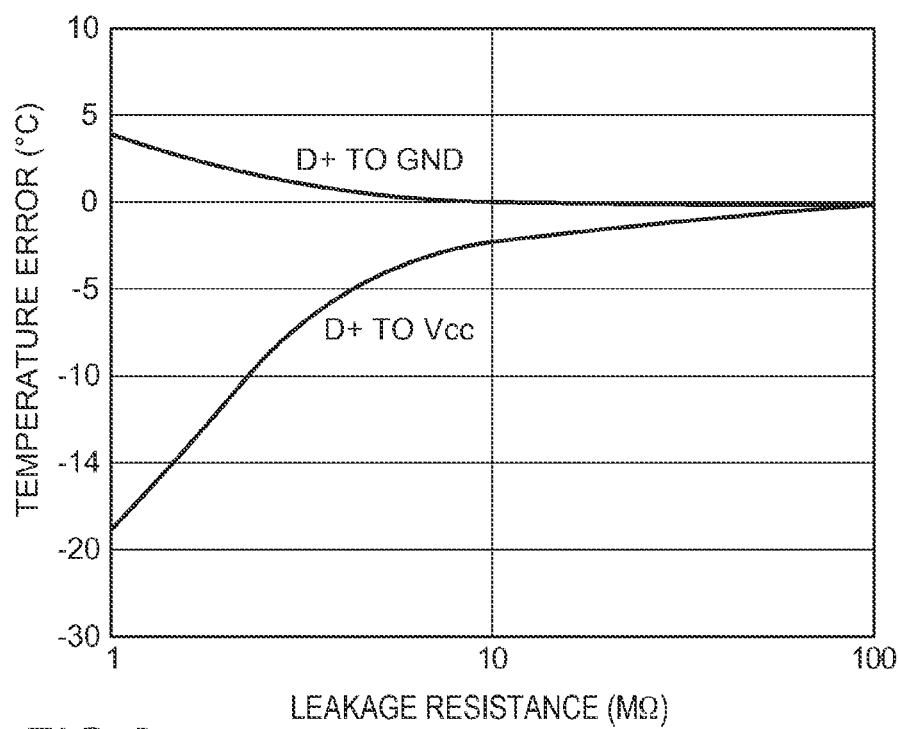
FIG. 6 illustrates a chart which correlates a leakage resistance amount with a temperature sensing error amount.

FIG. 6 illustrates a chart which correlates a leakage resistance amount with a temperature sensing error amount. In electronics, leakage refers to current which leaks out of a circuit. Leakage of this type can be measured by observing that a current flow at a first point does not match the current flow at the second point. This mismatch of current flow indicates that current is leaking out of the circuit between the first point and the second point. Leakage resistance is electrical resistance that opposes the current which leaks out of the circuit. In other words, the higher the leakage resistance, the smaller the current amount leaking from the circuit. Likewise, the lower the leakage resistance, the greater the current amount leaking from the circuit. The longer a signal has to travel to reach a destination, the more likely that the signal will suffer from leakage, subject to the leakage resistance. FIG. 6 shows that the lower the leakage resistance (i.e., the higher the leakage) is, the higher a resulting temperature error in the measured temperature of a critical thermal component is. For example, a 5 Mohm leakage resistance between D+ and $V_{cc}$ results in a temperature error of 5° C. Thus, a shorter connection between a temperature sensor and a thermal control IC reduces the likelihood of a significant temperature error, through reduction of leakage.

According to an embodiment of the invention, a microprocessor-based control IC is provided which includes a VR controller, multiple temperature sensors, and a cooling fan motor controller in a single circuit. In the embodiment, the output power of the VR is adaptively controlled by a microprocessor using monitored temperature information and cooling fan motor control information. As one of ordinary skill in the art would readily appreciate, "adaptively" refers to the ability to adapt, or change behavior, in response to a specific scenario. Thus, according to an embodiment of the invention, the output power of the VR is increased or decreased in response to the monitored temperature information and cooling fan motor control information. In the embodiment, the problems of multiple thermal control ICs and longer connections between a temperature sensor and a thermal control IC can be reduced, and a low cost solution can be provided, as will be described in more detail.

Figure 7:
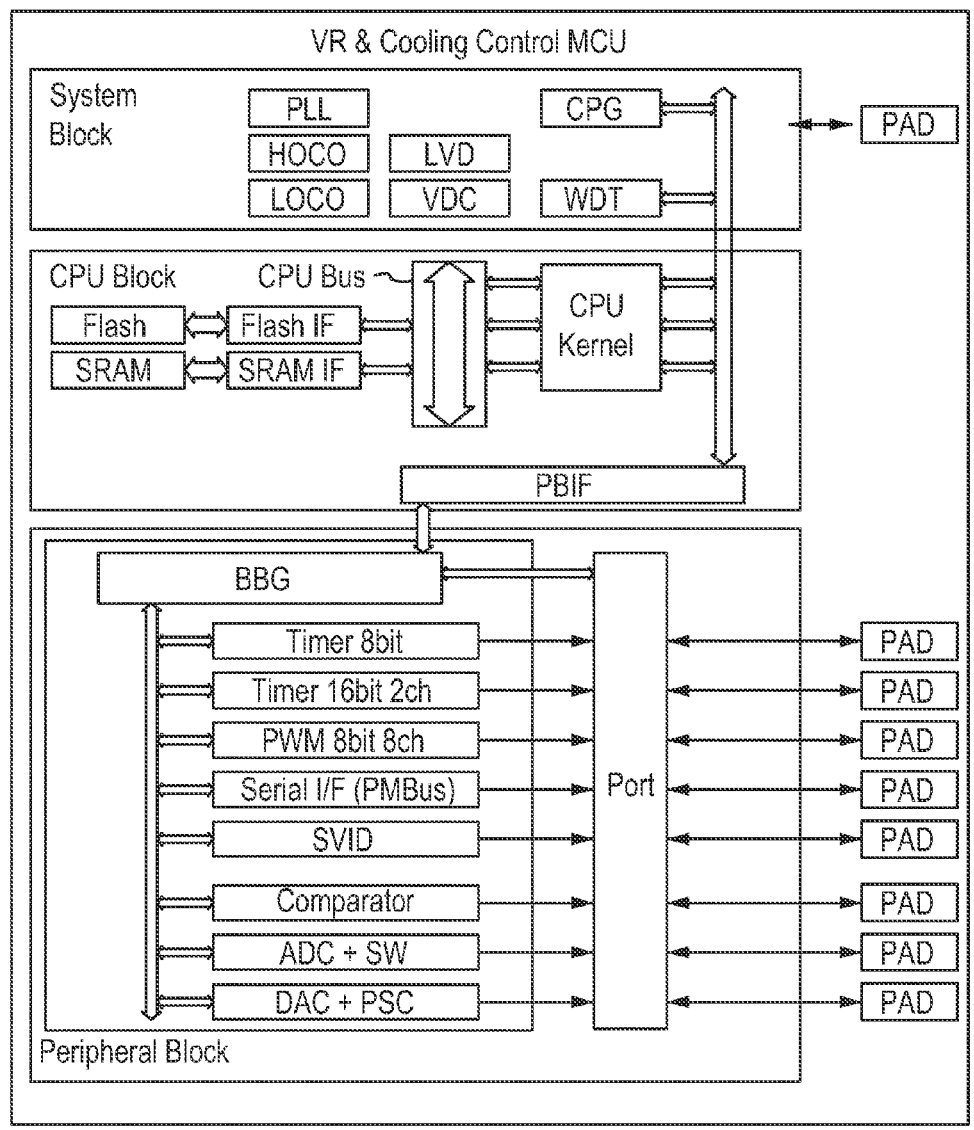
FIG. 7 illustrates a microcontroller unit-based voltage regulator and cooling control integrated circuit, according to an embodiment of the invention.

FIG. 7 illustrates a microcontroller unit-based VR and cooling control IC, according to an embodiment of the invention. In the illustrated embodiment, the VR and cooling control IC includes three blocks: a system block, a CPU block, and a peripheral block (identified as "System Block," "CPU Block," and "Peripheral Block" in FIG. 7, respectively).

In the embodiment, the system block includes an oscillator (identified as "PLL," "HOCO", and "LOCO" in FIG. 7), a $V_{cc}$ level monitor (identified as "LVD" and "VDC" in FIG. 7), and a clock generator (identified as "CPG," and "WDT" in FIG. 7).

The oscillator is a circuit configured to produce a repetitive electronic signal (also identified as a "clock signal"). This clock signal can be used to synchronize operations in a digital circuit. For example, the oscillator can be a harmonic oscillator configured to produce a sinusoidal output signal, or a relaxation oscillator configured to produce a non-sinusoidal output signal, such as a square wave or saw tooth wave. According to the embodiment, the oscillator can include a phase-locked loop ("PLL") which is a control system that generates a signal that has a fixed relation to a phase of a reference signal. The oscillator can also include a high-speed on-chip oscillator ("HOCO"). The oscillator can also include a low-speed on-chip oscillator ("LOCO"). The oscillator can either use the HOCO or the LOCO to produce the clock signal that the oscillator sends to the CPU or other component of the VR and cooling control IC. While both the HOCO and the LOCO are capable of producing a clock signal to synchronize operations in the VR and cooling control IC, the HOCO provides the clock signal at a higher frequency than the LOCO.

The $V_{cc}$ level monitor is a monitor configured to monitor a level of a supply voltage ("$V_{cc}$") of the VR and cooling control IC. The supply voltage is the voltage provided by a power supply terminal of the IC. According to the embodiment, the $V_{cc}$ level monitor can include a low voltage detector ("LVD") which is configured to detect when the $V_{cc}$ drops below a predetermined level. The $V_{cc}$ level monitor can also include a voltage down converter ("VDC"). The VDC is a circuit configured to step down supply voltage provided by a power supply terminal of the IC to an internal operation voltage of the IC.

The clock generator is a circuit configured to produce a timing signal (identified as a "clock signal") that is used to synchronize the operation of the VR and cooling control IC. The clock signal oscillates between a high state and a low state and is utilized like a metronome to coordinate the action of a circuit. The timing signal can be, for example, a symmetrical square wave, or other more complex arrangements. According to the embodiment, the clock generator can include a clock pulse generator ("CPG") which is configured to generate a pulse used for the clock signal. The clock generator can further include a watchdog timer ("WDT") which is configured to determine when a program run on the VR and cooling control IC, and trigger a system reset of the VR and cooling control IC.

In the embodiment, the CPU block includes a memory and interface ("IF") (identified as "Flash," "Flash IF," "SRAM," SRAM IF," and "CPU Bus" in FIG. 7), a CPU kernel (identified as "CPU kernel" in FIG. 7), and a peripheral block interface (identified as "PBIF" in FIG. 7).

The memory is a computer data storage configured to store digital data. In the embodiment, the memory includes a flash memory which is a non-volatile computer data storage that can be electronically erased and reprogrammed where data is retained even when no power is provided to the flash memory. In the embodiment, the memory also includes a static random access memory ("SRAM"), which is a computer data storage configured to store digital data using a bistable latching circuit, where the SRAM allows the data to be accessed in any order, and where the SRAM does not need to be periodically refreshed.

While the illustrated embodiment in FIG. 7 shows that the memory includes a flash memory and a SRAM, one of ordinary skill in the art would readily appreciate that the memory may include any kind of computer data storage known to one of ordinary skill in the relevant art, and still be within the scope of the invention.

The interface is configured to allow the memory to communicate with the rest of the VR and cooling control IC. In the illustrated embodiment, the flash interface (identified as "Flash IF" in FIG. 7) allows the flash memory to communicate with the rest of the VR and cooling control IC, and the SRAM interface (identified as "SRAM IF" in FIG. 7) allows the SRAM to communicate with the rest of the VR and cooling control IC.

According to the embodiment, the arithmetic calculator unit includes the CPU kernel, which is the portion of a computer system that is configured to carry out instructions of a computer program and is the primary element for carrying out a computer system's functions. The CPU kernel is also configured to receive and transceiver temperature data and PWM waveforms to and from different components of the microcontroller unit-based VR and cooling control IC.

The peripheral block interface is configured to allow the components of the system block and the CPU block to communicate with the components of the peripheral block.

In the embodiment, the peripheral block includes timers (identified as "Timer 8 bit," "Timer 16 bit 2 ch," and "PWM 8 bit 8 ch," in FIG. 7), a serial interface (identified as "Serial I/F (PMBus)," and "SVID" in FIG. 7), and an analog interface (identified as "Comparator," "ADC+SW," and "DAC+PSC," in FIG. 7).

A timer is a digital counter configured to either increment or decrement at a fixed frequency, which is configurable. A timer is also configured to compare its timer value against a specific value, and trigger an action when its timer value matches the specific value. In the embodiment, the timers illustrated in FIG. 7 can include an 8 bit timer (identified as "Timer 8 bit" in FIG. 7), a 16 bit timer (identified as "Timer 16 bit 2 ch" in FIG. 7), and a PWM timer (identified as "PWM 8 bit 8 ch" in FIG. 7). The 8 bit timer, the 16 bit timer, and the PWM timer can be used to generate a PWM signal.

The serial interface is configured to communicate with other components of the communication system by sending and receiving data one bit at a time. Thus, the serial interface is configured to send and receive a data stream. In the embodiment, the serial interface can include a serial interface configured to communicate with a power converter or other power system device, such as a PMBus (identified as "Serial I/F (PMBus)" in FIG. 7). The serial interface can also include a serial voltage identification digital ("SVID") interface (identified as "SVID" in FIG. 7). The SVID is configured to send and receive serial VID signals.

The analog interface is configured to interface with an analog signal. For example the analog interface can interface with a voltage or current. The analog signal connects through a bonding pad ("PAD") (identified as "PAD" in FIG. 7) to an IC pin (not shown).

In the embodiment, the analog interface can include a comparator (identified as "Comparator" in FIG. 7). A comparator is configured to compare two voltage or currents and determine which voltage or current is larger. In the embodiment, the analog interface can also include an ADC and a switch (identified as "ADC+SW" in FIG. 7). The ADC and switch circuit are configured for multiple temperature sensor input, and the PWM generator is configured for fan motor control, as will be described in more detail in relation to FIG. 8. In the embodiment, the analog interface can also include a digital-to-analog converter ("DAC"), and a Power SiP Controller ("PSC") (identified as "DAC+PSC") in FIG. 7). The DAC and PSC are configured for VR control, as will be described in more detail in relation to FIG. 9.

Figure 8:
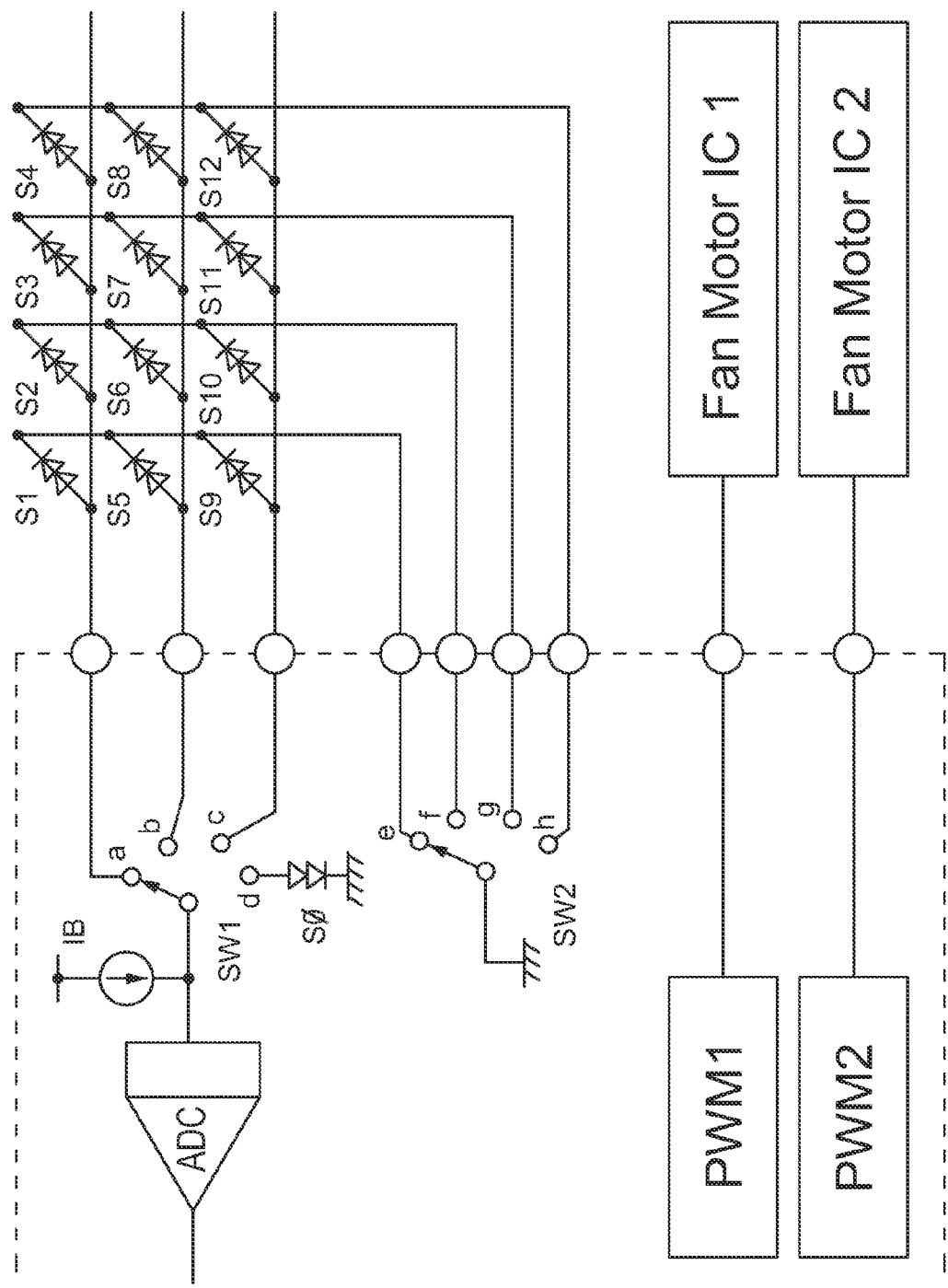
FIG. 8 illustrates a temperature sensor and fan control portion of a microcontroller unit-based control integrated circuit, according to an embodiment of the invention.

FIG. 8 illustrates a temperature sensor and fan control portion of a microcontroller unit-based control IC, according to an embodiment of the invention. In the illustrated embodiment, the temperature sensor and fan control portion of the microcontroller unit-based control IC includes an ADC (identified as "ADC" in FIG. 8), a bias constant current (identified as "IB" in FIG. 8), a calibrating sensor (identified as "S0" in FIG. 8), a matrix of temperature sensors (identified as "S1," "S2," "S3," "S4," "S5," "S6," "S7," "S8," "S9," "S10," "S11," and "S12," in FIG. 8), a selector row switch for the matrix of temperature sensors (identified as "SW1" in FIG. 8), a selector column switch for the matrix of temperature sensor (identified as "SW2" in FIG. 8), two PWM controllers (identified as "PWM1" and "PWM2" in FIG. 8), and two cooling fan motor control ICs (identified as "Fan Motor IC 1" and "Fan Motor IC 2" in FIG. 8).

In an embodiment, each temperature sensor can use continuous connected taping. Continuous connected taping keeps wafer location information from die pick-up to package fabrication and taping. This means that adjacent products in the tape can be built using adjacent dies on the wafer. The $V_{BE}$ (or Vf) of adjacent dies are matched so measured Vf and temperature information of The operation of the temperature sensor and fan control portion of a microcontroller unit-based control IC will now be described in accordance with an embodiment of the invention. According to the embodiment, during an initial calibration of the microcontroller unit-based control IC, selector row switch SW1 connects to a line which connects to calibration sensor S0 (identified as line "d" in FIG. 8) and measures the voltage generated by S0 using the ADC. This voltage is identified as "VT-0-0," and represents the voltage generated at a known temperature. For example, the voltage can represent the voltage generated at a predetermined temperature that is between 20° C. and 25° C. (identified as "room temperature"). The voltage VT-0-0 and the known temperature (identified as "T0-0") is stored in a built-in Flash read-only memory ("ROM") (not shown in FIG. 8) for an initial calibration. In an embodiment, this initial calibration can be performed during a microcontroller unit-based control IC fabrication testing process.

The relation between VT0-0, IB, and T0-0 is described below:

$$T0\text{-}0 = (0.5 * VT0\text{-}0 * q - Eg) / \ln(IB/A)$$

K is Boltzmann's constant (i.e., 1.38 E-23). q is the charge on the electron (i.e., 1.6 E-19 Coulombs). Eg is a silicon band gap energy (i.e., 1.11V). A is a current constant factor described in the equation: Is=Aexp(−Eg/kT), where Is is a saturation current.

The temperature sensitivity can be represented as $\Delta V/\Delta T = (Vf-Eg)/T$. When, Vf=0.5V, T=375K, $\Delta V/\Delta T=-1.65$ mV/K. Thus, when 2*Vf=1V, T=375K $\Delta V/\Delta T=-3.3$ mV/K. This is approximately 13 times larger than temperature sensitivity of previous control ICs.

Using the above formula, the microcontroller unit-based control IC can determine a control temperature of the IC based on the voltage generated by calibration sensor S0. According to the embodiment, the microcontroller unit-based control IC can utilize calibration to nullify the effect of the absolute value of $V_{BE}$ (or Vf) by device to device. Furthermore by using a calibration sensor, the stored voltage temperature, and a temperature sensor configured to monitor a temperature (e.g. S1), it is easy to calibrate the microcontroller during the power on sequence.

According to the embodiment, the microcontroller unit-based control IC is subsequently calibrated a second time. For example, the microcontroller unit-based control IC can be calibrated a second time upon a power on sequence of the microcontroller unit-based control IC, where power is first transmitted from a power supply to the microcontroller unit-based control IC. During this second calibration, the ADC measures the voltage generated by calibration sensor S0 ("identified as "VT0-1") and a control temperature of the IC ("T0-1") is determined using the VT0-0 and T0-0 values previously stored in the Flash ROM. In an embodiment, each temperature sensor of the matrix of temperature sensors S1-S12 can use continuous connected taping. Continuous connected taping keeps wafer location information from die pick-up to package fabrication and taping. This means that adjacent products in the tap can be built using adjacent dies on the wafer. The $V_{BE}$ (or Vf) of adjacent dies are matched so measured Vf and temperature information of S1 during the power on calibration can use the other temperature sensors (i.e., S2-S12) commonly.

According to the embodiment, the ADC detects a voltage of each temperature sensor of the matrix of temperature sensors in order to measure the temperature surrounding each temperature sensor. More particularly, selector row switch SW1 connects to a line which connects a first row of the matrix of temperature sensors (identified as line "a" in FIG. 8), and selector column switch SW2 scans each line connecting to each column of the matrix of temperature sensors (identified as lines "e," "f," "g," and "h" in FIG. 8). Through this scan, the ADC measures the voltage of temperature sensors S1, S2, S3, and S4 (identified as "VT1-1," "VT2-1," "VT3-1," and "VT4-1").

Selector row switch SW1 then switches to a line which connects to a second row of the matrix of temperature sensors (identified as line "b" in FIG. 8). Selector column switch SW2 then again scans each line connecting to each column of the matrix of temperature sensors (i.e., "e," "f," "g," and "h" in FIG. 8). However, this time, because row switch SW2 is connected to line b, rather than line a, selector column switch S2 scans the voltage of temperature sensors S5, S6, S7, and S8. Thus, based on this scan, the ADC measures the voltage of temperature sensors S5, S6, S7, and S8 (identified as "VT5-1," "VT6-1," "VT7-1," and "VT8-1").

Selector row switch SW1 then switches to a line which connects a third row of the matrix of temperature sensors (identified as line "c" in FIG. 8). Selector column switch SW2 then again scans each line connecting to each column of the matrix of temperature sensors (i.e., "e," "f," "g," and "h" in FIG. 8). Based on this scan, the ADC measures the voltage of temperature sensors S9, S10, S11, and S12 (identified as "VT9-1," "VT10-1," "VT11-1," and "VT12-1").

Using the temperature value T0-1 obtained during calibration, the microcontroller unit-based control IC calculates a set of measured temperatures (identified at "T1-1," "T2-1," . . . "T12-1,") based on the measured voltage values (i.e., "VT 1-1," "VT2-1," . . . "VT12-1"). This way, the microcontroller unit-based control IC obtains twelve points of temperature data. This temperature data is provided to PWM1 and PWM2, where PWM1 is configured to generate a PWM waveform to control Fan Motor IC 1 based on the temperature data, and where PWM 2 is configured to generate a PWM waveform to control Fan Motor IC 2. The temperature data and PWM waveforms are further provided to the CPU of FIG. 8 in order to control output power of the VR, as will be discussed in relation to FIG. 9 below in more detail.

In the illustrated embodiment, the ADC is a 10 bit ADC with a 10 bit dynamic range and 8 bit accuracy. However, one of ordinary skill in the art would readily appreciate that this is merely an example of an ADC. Likewise, in the illustrated embodiment, the IB is capable of emitting 100 uA of current, but this is merely an example current. Furthermore, in the illustrated embodiment, calibrating sensor S0 is a die built-in cascade connected silicon junction diode, and temperature sensors S1-S12 are external silicon junction diodes configured for temperature sensing. In the illustrated embodiment, the Vf is matched due to the use of continuous connected taping. However, one of ordinary skill in the art would readily appreciate that this is merely an example, and that calibration sensor S0 and temperature sensors S1-S12 can be any kind of sensor described above.

Furthermore, while in the illustrated embodiment, the microcontroller unit-based control IC includes twelve temperature sensors, in a 3×4 matrix, one of ordinary skill in the art would readily appreciate that the microcontroller unit-based control IC can include any number of temperature sensors, in any configuration, and still be within the scope of the invention. Likewise, while the microcontroller unit-based control IC includes two PWM controllers, and two fan motor ICs in the illustrated embodiment, one of ordinary skill in the art would readily appreciate that the microcontroller unit-based control IC can include any number of PWM controllers and any number of fan motor ICs, with each PWM controller controlling any number of fan motor ICs, and still be within the scope of the invention.

Although not shown in FIG. 8, in one embodiment of the invention, temperature sensors S1-S12 can be located near a thermal critical device, such as a CPU, GPU, or memory, such as a DIMM. Also, in one embodiment of the invention, a bias current can flow from selector row switch SW1 via line "a" to temperature sensor S1, to selector column switch SW2 via line "e" to ground.

The embodiment described above provides advantages that a $\Delta V_{BE}$ method implemented in a typical sensing input circuit cannot provide. For example, the sensitivity of a $\Delta V_{BE}$ method is approximately +0.26 mV/° C., whereas the sensitivity of a microcontroller unit-based control IC according to an embodiment of the invention is −3.3 mV/° C. This means that the microcontroller unit-based control IC has a higher noise immunity than the $\Delta V_{BE}$ method, as the same noise level produces a smaller deviation in temperature.

Furthermore, the microcontroller unit-based control IC according to an embodiment of the invention is also less sensitive to PCB leakage than the $\Delta V_{BE}$ method. Specifically, a 5 Mohm leakage resistance between a row line to Vcc will only change the bias current from 100 uA to 102 uA (IL=(12−1.4)/5 Mohm=2 uA). The $\Delta V_{BE}$ will only be 0.5 mV based on the following formula:

$$\Delta V_{BE} = kT/q \ln\{(IB)+(IL)/IB\} = 0.026 \ln(102/100) = 0.5 \text{ mV}$$

Based on a sensitivity of −3.3 mV/° C., a change of voltage of 0.5 mV only results in a temperature error of 0.15° C., which is considerably smaller than the temperature error of a typical sensing input circuit (i.e., −5° C.). Based on these reasons, the microcontroller unit-based control IC, according to an embodiment of the invention, is able to handle high noise conditions generally found in a long PCB layout pattern.

Figure 9:
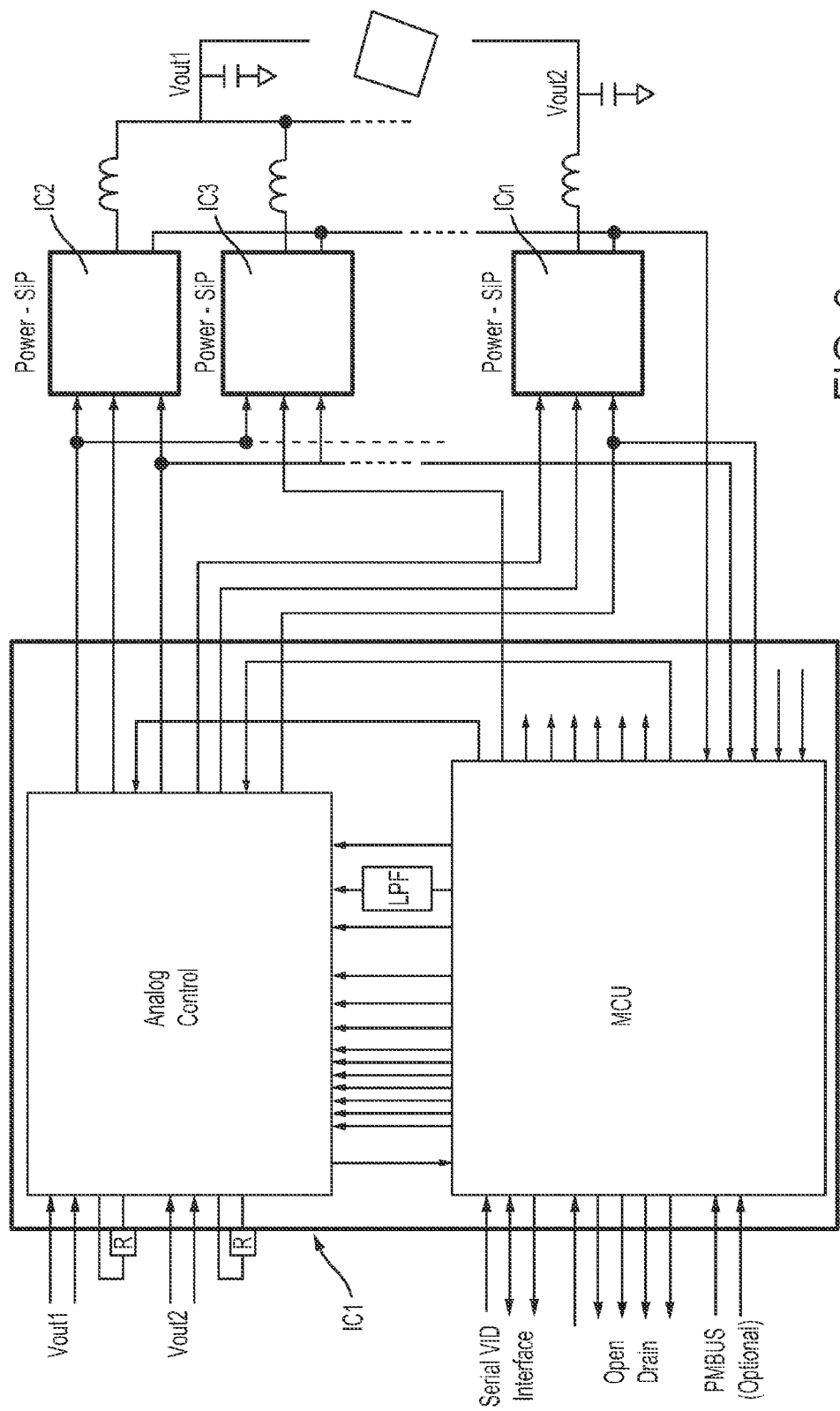
FIG. 9 illustrates a voltage regulator control portion of a microcontroller unit-based control integrated circuit and power system-in-packages, according to an embodiment of the invention.

FIG. 9 illustrates a VR control portion of a microcontroller unit-based control IC and power system-in-packages ("SiPs"), according to an embodiment of the invention. In the illustrated embodiment, the VR control portion of the microcontroller-based control IC includes a control IC (identified in FIG. 9 as "IC1"), and a plurality of power SiPs (identified as "IC2," "IC3," . . . "ICn"). One of ordinary skill in the art would readily appreciate that an embodiment may include any number of power SiPs and still be within the scope of the invention.

In the illustrated embodiment, as can be seen in FIG. 9, control IC IC1 receives voltage $V_{out1\&2}$ (identified in FIG. 9 as "$V_{out1}$" and "$V_{out2}$" to the left of IC1). Voltage $V_{out1\&2}$ represents a voltage generated by a thermal critical device (such as a CPU or a GPU) that is redirected to control IC IC1. Control IC IC1 compares voltage $V_{out1\&2}$ with a target voltage generated by a DAC in order to determine a voltage error. Control IC IC1 then transmits the voltage error and a set of timing signals to power SiPs IC2, IC3, . . . ICn. Specifically, control IC IC1 transmits a voltage error corresponding to $V_{out1}$ to power SiPs IC2, IC3, . . . ICn−1, and transmits a voltage error corresponding to $V_{out2}$ to power SiP ICn. Control IC IC1 further sends a set of multi-phase timing signals to power SiPs IC2, IC3, . . . ICn−1, where each timing signal is a different phase, and sends a single-phase timing signal to power SiP ICn. Power SiPs IC2, IC3, . . . ICn each receive the voltage errors and timing signals, and each generate a PWM signal and voltage output based on the received voltage errors and timing signals. Specifically, power SiPs IC2, IC3, . . . ICn−1 collectively receive a voltage error corresponding to $V_{out1}$ and a set of multi-phase timing signals, where each timing signal is a different phase, and collectively generate a PWM signal and voltage output $V_{out1}$ (identified in FIG. 9 as "$V_{out1}$" to the right of IC2). Furthermore, power SiP ICn receives a voltage error corresponding to $V_{out2}$ and a single-phase timing signal, and generates a PWM signal and voltage output $V_{out2}$ (identified in FIG. 9 as "$V_{out2}$" to the right of ICn).

According to an embodiment, the VR control portion of a microcontroller unit-based control IC is a scalable solution, as any number of power SiPs can be added as needed. According to the embodiment, VR output voltage (and output power) is controlled in order to balance between the voltage necessary for a thermal critical device to complete a task, and the heat generated by a resulting voltage).

Figure 10:
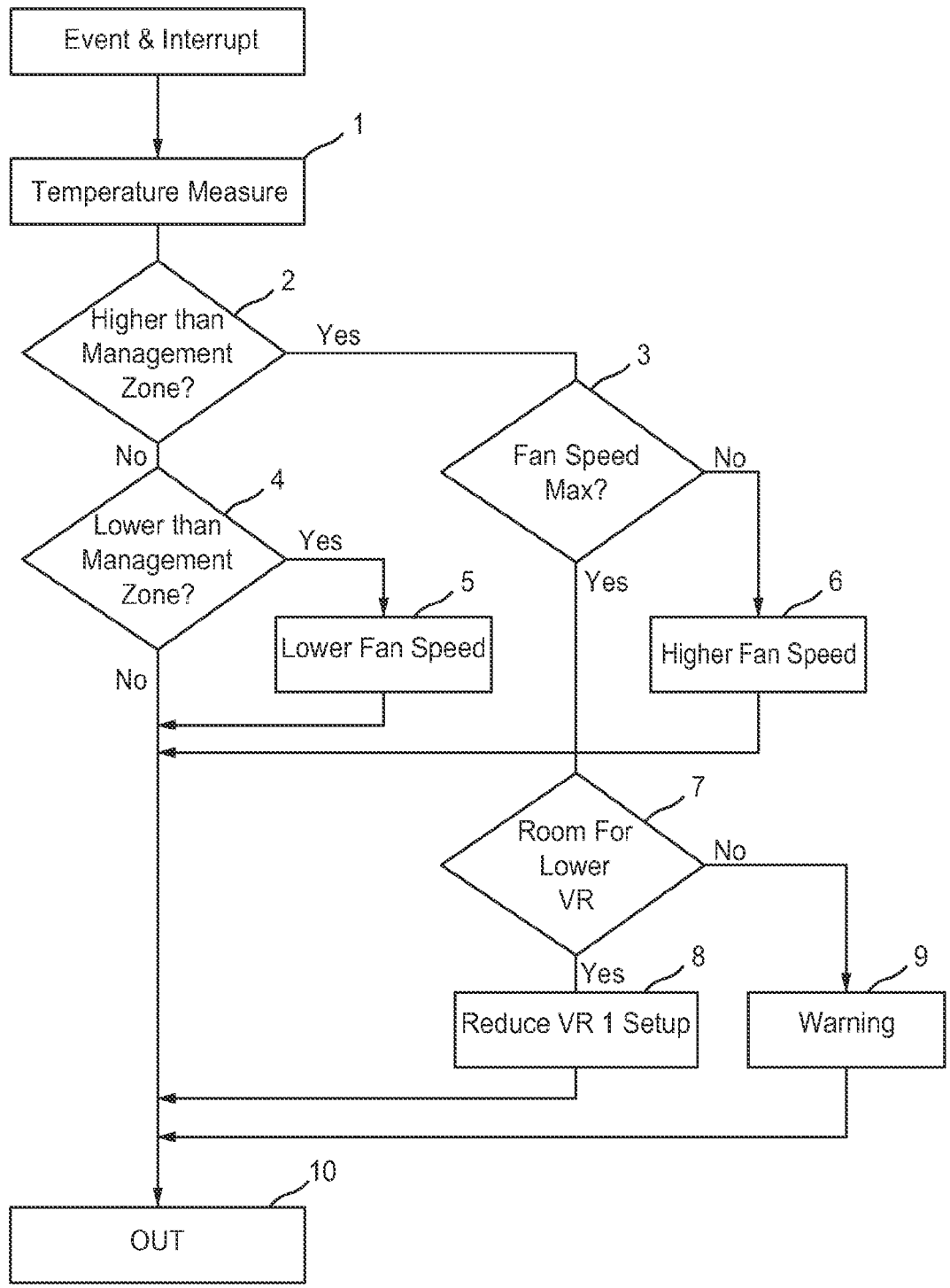
FIG. 10 illustrates a voltage regulator and cooling control method according to an embodiment of the invention.

FIG. 10 illustrates a VR and cooling control method according to an embodiment of the invention. In an embodiment, the VR and cooling control method can be implemented at a microcontroller unit-based VR and cooling control IC.

In order to initiate the method illustrated in FIG. 10, the VR and cooling control IC first generates an interrupt using a MCU built-in timer. After generating the interrupt, at step 1, a temperature is measured. The temperature may correspond to a temperature of a thermal critical device, such as a CPU or a GPU. At step 2, it is determined whether the measured temperature is higher than a first threshold. A first threshold can be a temperature where the thermal critical device can overheat if operated for a significant duration of time at the temperature. If the measured temperature is higher than the first threshold, the method proceeds to step 3, which is described below in more detail. Back at step 2, if the measured temperature is not higher than the first threshold, the method proceeds to step 4, which is also described in more detail.

At step 3, a speed of a cooling fan is determined. The cooling fan may be a cooling fan configured to decrease the temperature of a thermal critical device. If a speed of the cooling fan is less than a maximum speed of the cooling fan, this means that the speed of the cooling fan can be increased in order to decrease the measured temperature below the first threshold. If it is determined that the speed of the cooling fan is less than the maximum speed, than the method proceeds to step 6, where the speed of the cooling fan is increased. After step 6, the method proceeds to step 10 where the method completes. If it is determined that the speed of the cooling fan is not less than the maximum speed, then the method proceeds to step 7.

At step 7, it is determined whether the voltage generated by the VR can be decreased. If the speed of the cooling fan cannot be increased, another way to decrease the temperature measured at step 1, is to decrease the voltage generated by the VR. As an example, it is determined if the thermal critical device can operate with a decreased voltage. If the thermal critical device can operate with a decreased voltage, then the voltage generated by the VR can be decreased. If it is determined that the voltage generated by the VR can be decreased, the method proceeds to step 8. At step 8, the VR is decreased by a step, resulting in the decrease of the voltage generated by the VR. In this context, a step is a unit of measurement, such as a volt. Therefore, a step can equal 5 mv, or any number of volts. Furthermore, a step is not limited to a volt as a unit of measurement, and can be any other measurement for measuring voltage. The method proceeds to step 10, where the method completes. Back at step 7, if it is determined that the voltage generated by the VR cannot be decreased, than the method proceeds to step 9. At step 9, a warning is issued. The warning can be a warning that the thermal critical device is in danger of overheating, and there is no way to decrease the temperature. The method subsequently proceeds to step 10, where the method completes.

Back at step 4, where it was determined at step 3 that the temperature measured at step 1 was not higher than a first threshold, it is determined whether the measured temperature is lower than a second threshold. A second threshold can be a temperature where there is no significant threat of the thermal critical device overheating, and where it is desired to decrease the speed of the corresponding cooling fan in order to conserve power. If the measured temperature is lower than the second threshold, the method proceeds to step 5. At step 5, a speed of the cooling fan is decreased. The method then proceeds to step 10, where the method completes. Back at step 4, if it is determined that the measured temperature is not lower than a second threshold, then the method proceeds to step 10, where the method completes.

According to embodiments of the invention, a VR controller, multiple temperature sensors, and a cooling fan controller can be provided on a single device. Thus, the number of thermal control ICs can be reduced, even in the presence of multiple temperature sensors. This can reduce the overall size of the PCB. Furthermore, a connection length between a temperature sensor and a thermal control IC, and between a VR and a cooling fan can also be reduced, which can further reduce the overall size of the PCB, and reduce potential temperature error. Furthermore, in certain embodiments, a microcontroller unit is capable of intelligent control of VR and cooling in order to provide secure operation with minimum power consumption.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:
1. An apparatus, comprising:
an integrated circuit comprising a microprocessor and a first temperature sensor configured to generate a reference temperature signal corresponding to a temperature of the microprocessor; and
temperature sensors, wherein the temperature sensors are configured to generate respective temperature signals corresponding to respective temperatures of components including the microprocessor,
wherein the microprocessor is configured to make an external temperature calibration using the reference temperature signal, and
wherein the microprocessor is configured to process the temperature signals.
2. The apparatus of claim 1, further comprising:
a cooling fan motor controller formed on the integrated circuit and configured to control a speed of a fan.
3. The apparatus of claim 1, further comprising:
a voltage regulator controller formed on the integrated circuit and configured to generate a voltage and provide the voltage to one of the components.
4. The apparatus of claim 1, further comprising:
a cooling fan motor controller formed on the integrated circuit; and
a voltage regulator controller formed on the integrated circuit,
wherein the microprocessor, cooling fan motor controller, and voltage regulator controller are configured to cause the apparatus to control the temperature of one of the components using one of the temperature signals.
5. The apparatus of claim 1, wherein the temperature sensors are selectively coupled to the microprocessor via first and second switches.
6. The apparatus of claim 1, wherein the microprocessor is further configured to scan multiple temperature sensors in a known temperature condition in order to calibrate the multiple temperature sensors.
7. The apparatus of claim 1, further comprising a diode temperature sensor configured to generate a signal corresponding to a forwarding voltage during production testing for subsequent calibration of the temperature sensors.
8. A method comprising:
generating a reference temperature signal corresponding to a temperature of a microprocessor;
generating a plurality of temperature signals corresponding to respective temperatures of components including the microprocessor;
the microprocessor processing the reference temperature signal and at least one temperature signals to make a temperature calibration.

9. The method of claim 8 further comprising a cooling fan motor controller controlling a speed of a fan.

10. The method of claim 8 further comprising a voltage regulator controller generating and providing a voltage to one of the components.

11. The method of claim 1 further comprising the microprocessor scanning multiple temperature sensors in a known temperature condition in order to calibrate the multiple temperature sensors.

* * * * *